(12) United States Patent
Sauer

(10) Patent No.: US 7,622,991 B2
(45) Date of Patent: Nov. 24, 2009

(54) TRANSCONDUCTANCE SIGNAL CAPACITY FORMAT

(76) Inventor: Don Roy Sauer, 1499 Cliff Dr., San Jose, CA (US) 95132

( * ) Notice: Subject to any disclaimer, the term of this patent is extended or adjusted under 35 U.S.C. 154(b) by 0 days.

(21) Appl. No.: 11/843,075

(22) Filed: Aug. 22, 2007

(65) Prior Publication Data

US 2009/0051439 A1    Feb. 26, 2009

(51) Int. Cl.
*H03F 3/45* (2006.01)
(52) U.S. Cl. .......................... 330/256; 330/69
(58) Field of Classification Search .............. 330/256
See application file for complete search history.

(56) References Cited

U.S. PATENT DOCUMENTS

| | | | |
|---|---|---|---|
| 4,006,428 A * | 2/1977 | Meyer et al. | 330/51 |
| 4,339,729 A | 7/1982 | Jason et al. | |
| 4,757,273 A * | 7/1988 | Bray | 330/256 |
| 5,394,112 A * | 2/1995 | Alini et al. | 330/256 |
| 5,396,188 A | 3/1995 | Aoki | |
| 5,432,474 A | 7/1995 | Lauffenburger et al. | |
| 5,440,264 A | 8/1995 | Sevenhans et al. | |
| 5,559,470 A | 9/1996 | Laber et al. | |
| 6,020,786 A | 2/2000 | Ashby | |
| 6,194,959 B1 | 2/2001 | Kamoshida et al. | |
| 6,967,526 B1 * | 11/2005 | Churchill | 330/9 |
| 6,972,625 B2 * | 12/2005 | Nguyen et al. | 330/254 |
| 7,164,311 B2 | 1/2007 | Chowdhury et al. | |

* cited by examiner

*Primary Examiner*—Henry K Choe

(57) ABSTRACT

Operational transconductance amplifiers have a natural signal capacity format in which signal performance can be expressed in terms of fixed percentages. Input signal can be applied to Operational transconductance amplifiers in this natural signal capacity format in order to optimize performance. A signal which drives a given Operational transconductance amplifier architecture to produce an output current which is at 50% of it's maximum available output current can be thought of as applying an input voltage which is at 50% of an Operational transconductance amplifier's maximum input voltage capacity. In this input/output channel capacity format, dc offset, distortion, and noise all are temperature independent. By translating input signal between a voltage format to a channel capacity format using the methods of this invention, output signal performance attributes such as gain, frequency response, dc offset, temperature drift, distortion, and noise, can all be optimize over the full temperature range for all types of Operational transconductance amplifier architectures and applications.

8 Claims, 5 Drawing Sheets

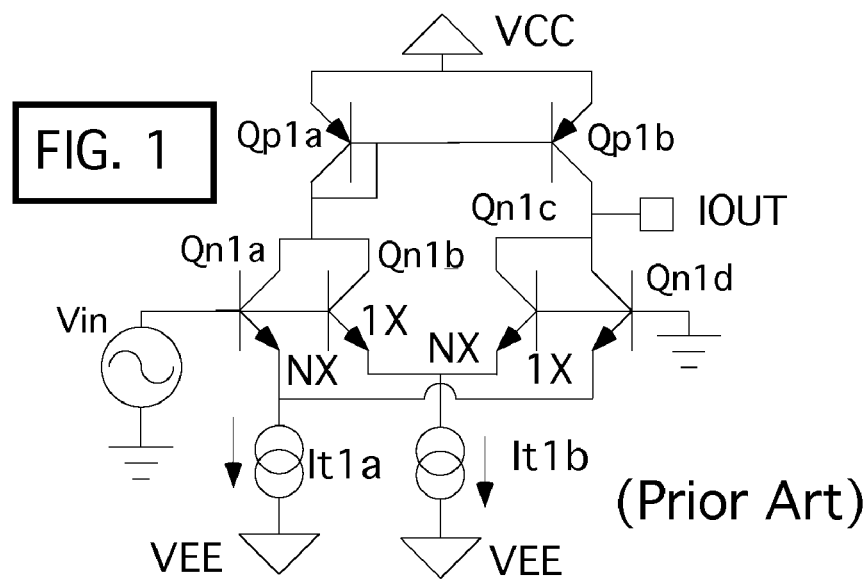
FIG. 1 (Prior Art)
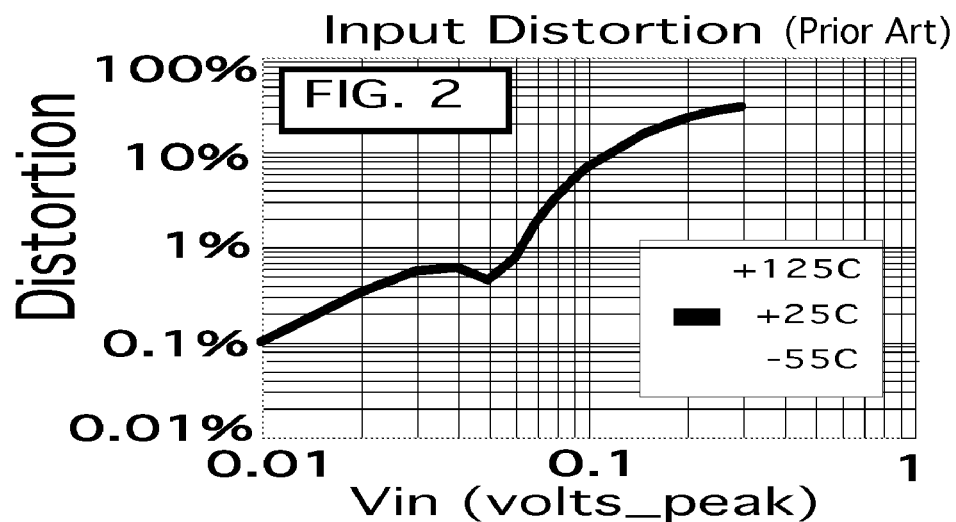
FIG. 2 Input Distortion (Prior Art)
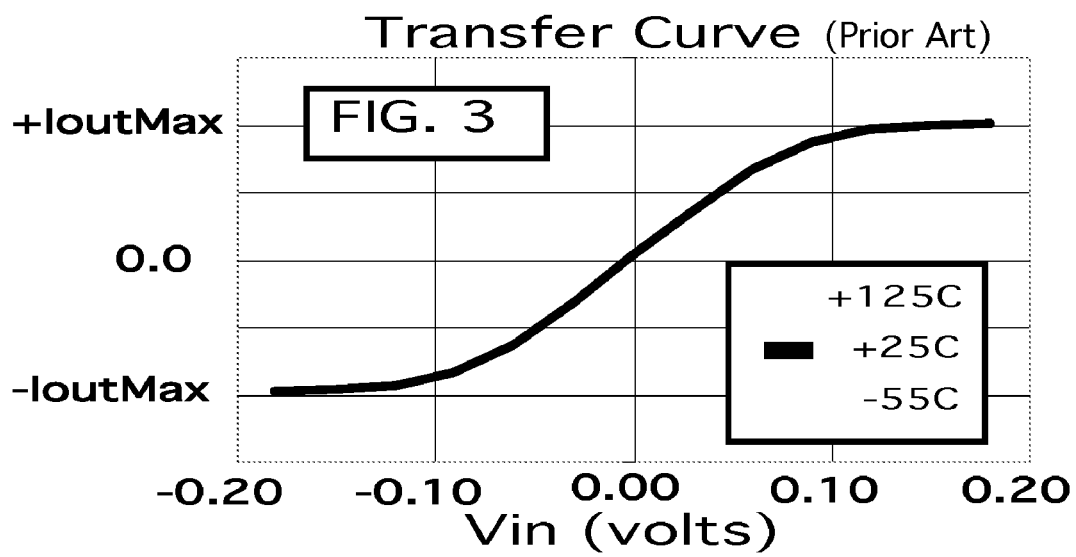
FIG. 3 Transfer Curve (Prior Art)

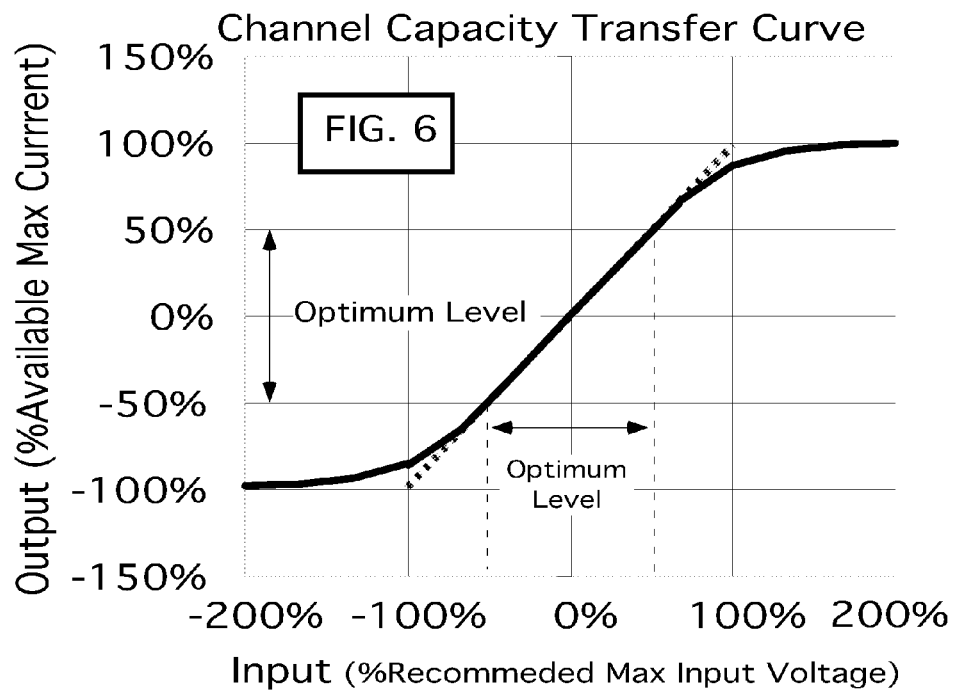
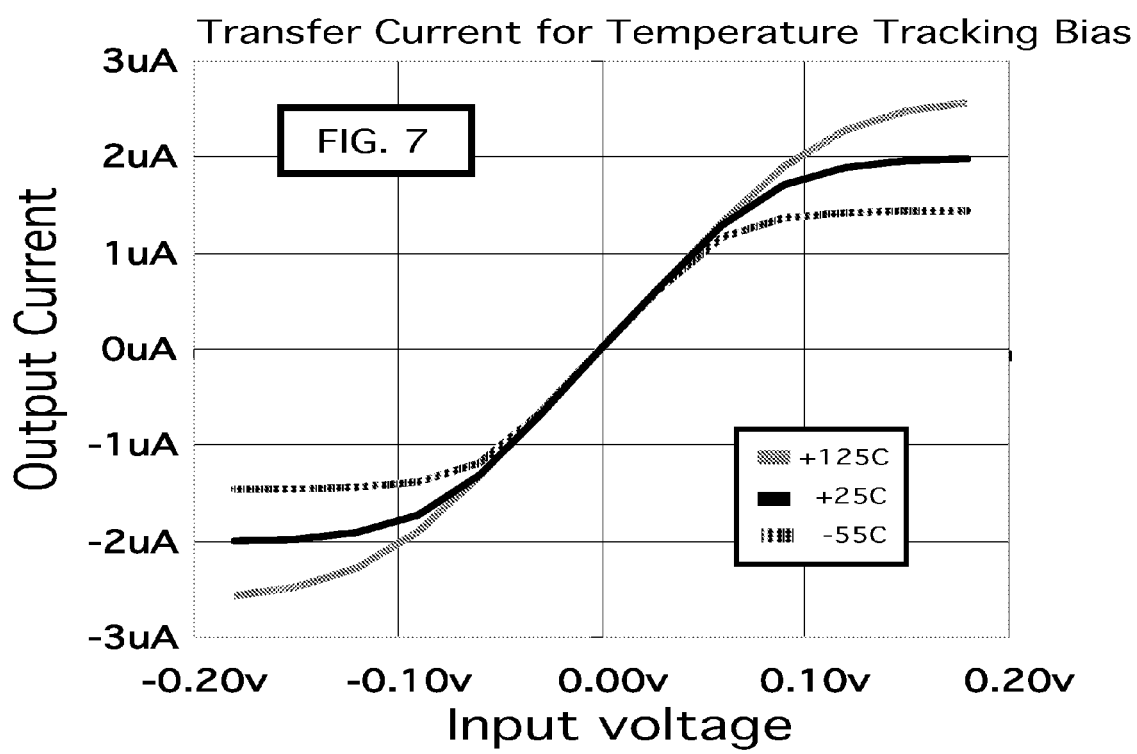

VinMax (Recommended)
120mV @125C
90mV @+27C
65mV @-55c

Ibias8a = 1uA @room (tracking Temp)

OTA8a, Buffer8a, OTA8b

Vin8a =50% of VinMax
R8a= 90KOhms
Vout8a =50% of Vmax $$H(s) = 1/(s^2 + s \cdot w0/Q + w0^2) \qquad EQ.7a$$

OTA9a, Buffer9a, OTA9b, Buffer9b
R9a, C9a, C9b
R9b = Q*R9a_7
R9c = R9a

TRANSCONDUCTANCE SIGNAL CAPACITY FORMAT

FIELD OF THE INVENTION

This invention relates to processing signal in Operational Transconductance Amplifiers in terms of a native channel capacity format instead of in terms of voltages or currents. In the channel capacity format, all performance attributes become stable over temperature. Since the level of input signal is chosen to be a compromise between all the performance requirements, an optimum level chosen at room temperature will remain optimum over temperature. The transformation of input signal from voltage or current format to and from a channel capacity format requires some extra circuitry and magnitude adjustments. The intention of the invention is to be to able to operate a multiple of serially connected Operational Transconductance Amplifier stages such that the output signal is maintained at an optimum level of performance in terms of gain, frequency response, dc offset, temperature drift, distortion, and noise, in a manner independent of temperature.

BACKGROUND

The signal level chosen to apply to Operational Transconductance Amplifier is a compromise between performance requirements. Noise, and DC offset encourage larger input signal voltages. Distortion encourages lower input voltage signals. In Operational Transconductance Amplifiers, noise, DC offset, distortion, and gain are all varying as a function of temperature to the extent that performance is often degraded. Newer Operational Transconductance Amplifiers employ some distortion cancellation techniques to allow larger levels of input signal voltage. The input stage of FIG. 1 was proposed by Okanobu in U.S. Pat. No. 4,965,528 issued Oct. 23, 1990. FIG. 1 shows this input stage uses transistor area scaling to apply equal and opposite DC offset voltages to two simple differential input stages. Both input stages are biased up with equal currents It1$a$ and It1$b$. At the right magnitude of N, the distortion from transistors Qn1$a$ and Qn1$d$ are cancelled by the equal and opposite distortion from Qn1$b$ and Qn1$c$. FIG. 1 adds a PNPs Qp1$a$ and Qp1$b$ to subtract the difference between the collector currents to produce a differential output current. The distortion of such an Operational Transconductance Amplifier architecture using a N value a 5 is shown in FIG. 2. For input signal expressed in terms of voltage, FIG. 2 shows that different levels of peak input voltage will have different levels of distortion at different temperatures. The distortion curves scale to absolute temperature. All Operational Transconductance Amplifiers without resistors, have this same relationship to temperature. This also applies to CMOS input stages which operate in the subthresshold region.

In addition to distortion, Operational Transconductance Amplifier see temperature variations in DC offset, noise, and gain. The transconductance transfer curve for the circuit of FIG. 1 is shown in FIG. 3. Gain is also has a direct relationship with absolute temperature. In most Operational Transconductance Amplifier applications, it is desirable for the voltage to current relationship of the transfer curve to come close to matching a perfect resistor. In gain or filter applications, an Operational Transconductance Amplifier stage will be functioning like an electrically controlled resistor. This invention teaches that the very steps that are needed to make an Operational Transconductance Amplifier behave like a perfect resistor also naturally set up the operation in the channel capacity format. The invention shows how to operate Operational Transconductance Amplifiers in a way that holds both impedances and performances to be constant regardless of temperature.

BRIEF SUMMARY OF THE INVENTION

This invention translates signal for a given Operational Transconductance Amplifier architecture into a channel capacity format featuring of both constant impedances, and constant performance, regardless of temperature. The intention is to be to able to operate a multiple of connected Operational Transconductance Amplifier stages such that the output signal maintains an optimum level of performance in terms of gain, frequency response, dc offset, temperature drift, distortion, and noise, in a manner independent of temperature.

BRIEF DESCRIPTION OF THE DRAWINGS

Non-limiting and non-exhaustive embodiments are described with reference to the following drawings:

FIG. 1 illustrates an Operational Transconductance Amplifier stages using a distortion cancellation architecture to extent input voltage range and lower distortion. This differential input stage was proposed by Okanobu in U.S. Pat. No. 4,965,528 issued Oct. 23, 1990.

FIG. 2 illustrates the distortion of the Operational Transconductance Amplifier stage shown in FIG. 1. The distortion is shown to be variable in terms of the peak input voltage, and the peak value relative to temperature.

FIG. 3 illustrates the transfer function for the Operational Transconductance Amplifier stage shown in FIG. 1A, as a function of temperature.

FIG. 6 illustrates the transfer function for the Operational Transconductance Amplifier stage shown in FIG. 1 in the channel capacity format, in which the transfer curve has become dimensionless and temperature independent.

FIG. 7 illustrates that biasing a Operational Transconductance Amplifier with a current scaling to absolute temperature allows Transconductance to become temperature independent.

DETAILED DESCRIPTION OF THE PREFERRED EMBODIMENT

Figure 4:
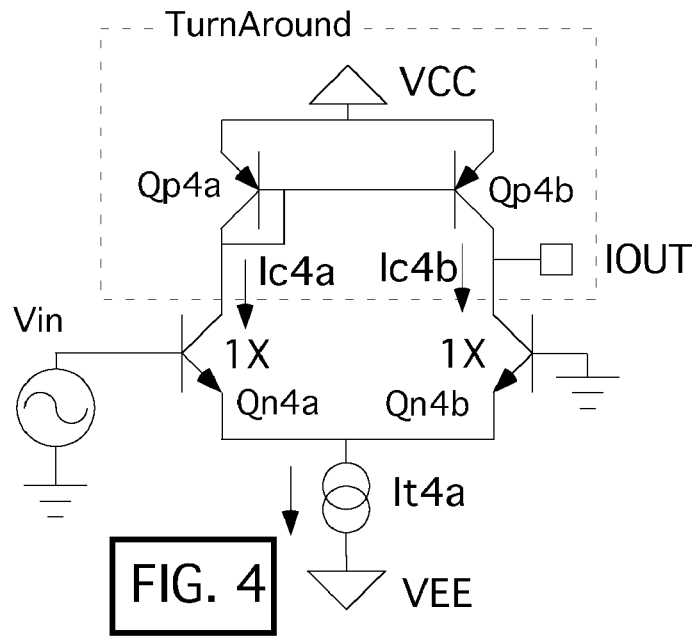
FIG. 4 illustrates a standard Operational Transconductance Amplifier stages consisting of a two transistor differential input stage consisting of transistors Qn4$a$ and Qn4$b$ and connected to a turnaround consisting of transistors Qp4$a$ and Qp4$b$.

A simple representation of an Operational Transconductance amplifier is shown in FIG. 4. The transconductance action is taking place in transistors Qn2a and Qn2b which convert a differential input voltage applied to the two bases into a differential output current between the two collectors. Transistor Qp2a and Qp2b are performing the current subtraction process of a current turnaround such that a differential output current appears at the output node. The output performance of this Operational Transconductance amplifier is specified in terms of gain, offset, distortion, and signal to noise error. These errors can be modeled as an array of small voltage sources connected in series with the input signal. All of these referred to input error signals are changing with temperature.

The fact that the DC offset voltage will vary with temperature means that an Operational Transconductance amplifier can operate like a real time temperature sensor. In applications where the electronics draw enough power to require ventilation, any fluctuations in temperature will appear as a low frequency background noise signal. A typical DC offset of 1 mV will vary by 3.3 uvolts for every degree change in ambient temperature. The low frequency 1/f noise in bipolar transistors has a peak-to-peak value about six times less.

An Operational Transconductance amplifier can be defined to be operating at 50% of its capacity when it is producing an output current that is 50% of its maximum output current capacity. When operating at 50% of its output current capacity, it can thought of receiving an input voltage at 50% level of what is essentially it's maximum input voltage capacity. The signal in the channel capacity format can be treated as being as being at the same percentage in terms of either input voltage capacity or output current capacity.

An input DC offset for bipolar transistors is modeled as a mismatch in transistor area. A 1 mV voltage offset corresponds to about a 4% area mismatch between transistors Qn4a and Qn4b in FIG. 4. The equation (1) that it follows is below.

$$(Vbe2-Vbe1)=(kt/q)*\ln(Area1/Area2) \quad (1)$$

In FIG. 4 if Qn4a is 4% larger than Qn4b, then collector current Ic4a will be 2% higher that one half the current of It4a, and the collector current Ic4b will be 2% lower that one half the current of It4a graph. Since the maximum available output current for FIG. 4 is It4a, there will be a DC offset current at the output which will remain at a constant 2% of maximum available output current, regardless of temperature. In the format of input voltage, DC offset for a 1 mV offset appears to move 3.3 uV for every degree change. In the percentage format however, offset appears as a temperature independent 2% output current error.

The input voltage for the Operational Transconductance amplifier architecture of FIG. 4 is around 52 mV at room temperature. The very same 1 mV of DC offset voltage corresponds to a 2% of maximum recommended input voltage. But the maximum recommended input voltage scales directly with absolute temperature like the DC offset voltage. So a 2% DC relative output current error also corresponds to a 2% DC relative input voltage error regardless of temperature. When input signal is converted to a channel capacity percentage format, it will therefore scale directly with absolute temperature. In doing so, it will remain the same magnitude relative to the DC offset, regardless of temperature.

Different Operational Transconductance amplifier architectures will be having different values for a maximum recommended input voltage. The architecture of FIG. 1 has a level around 90 mV when the value N is set close to 5. There are other Operational Transconductance amplifier architectures with twice that level. CMOS transistors operating in the subthreshold region operate at about a 50% larger input voltage relative to bipolars using the same architecture. All such architectures operate under a modified version of equation (1).

The most dominate noise in bipolar is shot noise. This noise is really independent of how a bipolar transistor is fabricated. Shot noise is statistical in that it is defined by how many electrons or holes flow across an emitter base junction. Defined in terms of being an rms current relative to the maximum available output current, the equation (2) is given below.

$$I\_rms/Idc=\text{sqrt}(2*q*\text{Bandwidth}/I\_dc) \quad (2)$$

Figure 5:
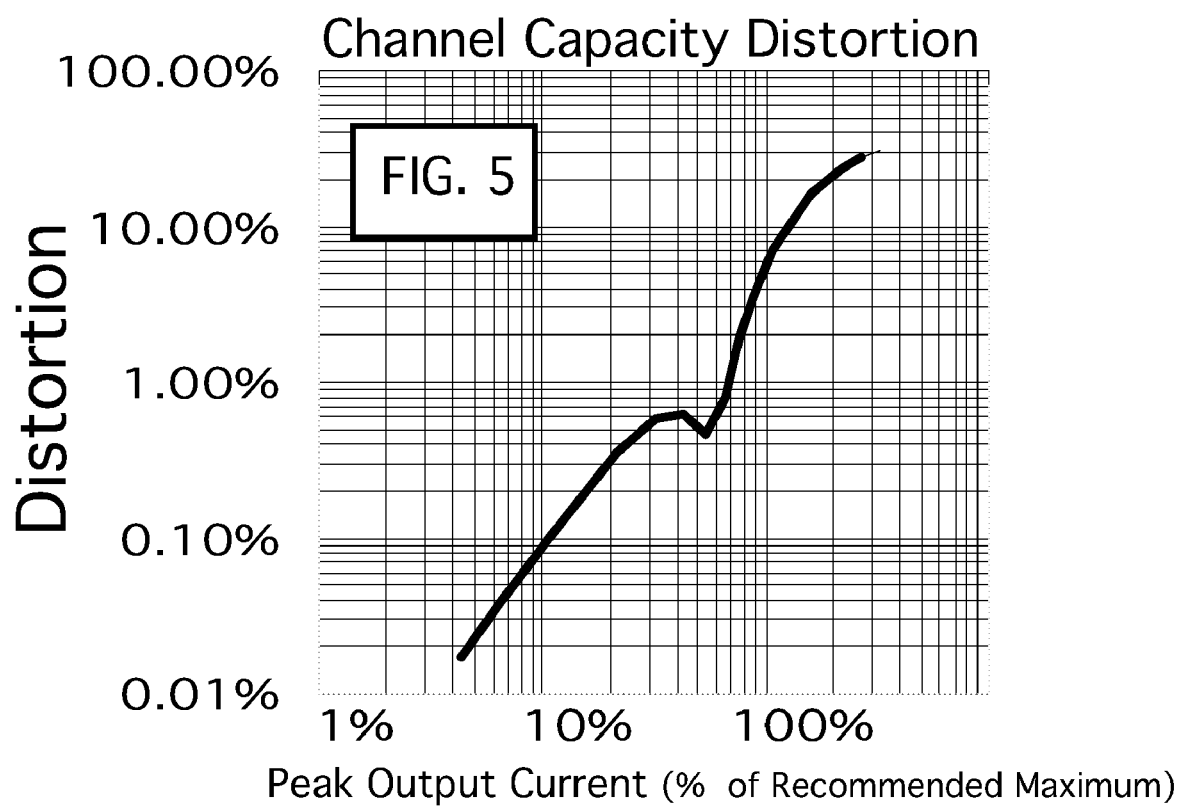
FIG. 5 illustrates the distortion of the Operational Transconductance Amplifier stage shown in FIG. 1, but plotted in terms of channel capacity, in which distortion is in a temperature independent format.

The shot noise equation (2) shows that the channel's signal to noise ratio is purely a function of the number of charged particles flowing across an emitter base region. Where as a the circuit of FIG. 4 may typically have a DC output current error with a standard deviation of 2% of the output channel capacity, the rms value of output noise current over a audio bandwidth is closer to 0.001% the output channel capacity. Noise can be modeled as moving offset. Signal converted to a channel capacity percentage is also be temperature independent relative to background noise The distortion curve of FIG. 2 shows the dependency of input distortion as a function of temperature for the circuit of FIG. 1. The curve of FIG. 5 is the same curve translated to the channel percentage capacity format. The temperature effects are removed, and so an Operational Transconductance amplifier operating with signal at a fixed channel capacity percentage level, should have distortion, dc offset, and noise be independent of temperature.

Operational Transconductance amplifier are typically used within their linear region, as shown in FIG. 6. Because of the linearity within the 50% region of available output current, the one to one relationship between inputs and outputs in terms of percent values holds pretty well. A 2% error of offset can be modeled as either applying a 2% relative input voltage or a 2% relative output current.

Figure 8:
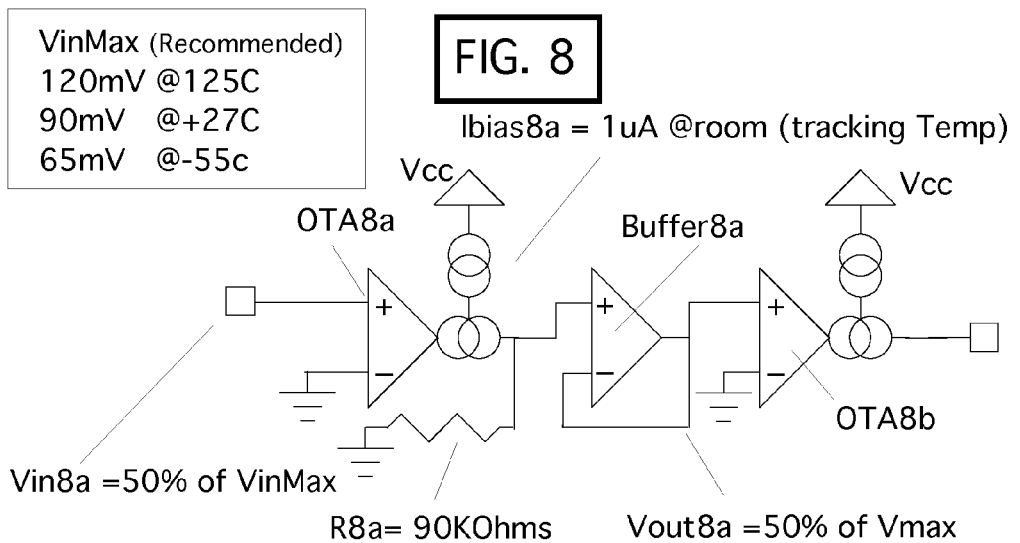
FIG. 8 illustrates how biasing a Operational Transconductance Amplifier with a current Ibias8$a$ with scaling to absolute temperature also generates voltage signals at input node Vin8$a$ compatible with the channel capacity signal format to voltage node Vout8$a$ and buffer Buffer8$a$ which further drives OTA8$b$ with the channel capacity signal format.

The voltage to current relationship or transconductance is also a function of temperature. FIG. 3 shows the transfer curves for the circuit of FIG. 1 as a function of temperatures. If the bias current of an Operational Transconductance amplifier is also set to scale to absolute temperature, transconductance become temperature independent as shown in FIG. 7. At the low input levels, it is desirable that an Operational Transconductance amplifier can behave like a perfect resistor which does not drift with temperature. There is a type of on chip resistor, the SiChrome resistor, which operates close to having a zero TC. This type of resistor has much tighter resistance tolerances. Such a resistor can be used together with a bandgap to generate such a bias current for an Operational Transconductance amplifier. If the transconductance is behaving like a perfect resistor, then connecting a like a perfect resistor to an Operational Transconductance amplifier's output will product a gain stage that is stable over temperature. The application shown in FIG. 8 is that of an attenuation stage. The current value of Ibias8a is set to be maximum at 1 uA where the gain will be one. Gain is designed to decrease by reducing the value of Ibias8a.

When the bias current of an Operational Transconductance amplifier is set to scale to absolute temperature, it provides an additional feature. If the Operational Transconductance amplifier architecture defines input voltage capacity to be 90 mV, then the values of Ibias8a and R8a can be designed to provide the same output voltage capacity to also be at 90 mV. If OTA8a is being driven at 50% of its capacity from node Vin8a, it will in turn drive buffer Buffer8a and voltage node Vout8a to drive OTA8b at no higher that 50% of its channel capacity. The concept of constant impedance at constant performance is being shown in FIG. 8. All signal voltages and currents in FIG. 8 will scale directly with absolute temperature. Since both voltages and currents scale together, the transconductances will be independent of temperature. The signal is being held at a constant percentage level, so the performance can be held to be temperature independent as well. Input signal is therefore processed at constant impedance and performance by applying this native percentage format to Operational Transconductance Amplifiers.

Figure 9:
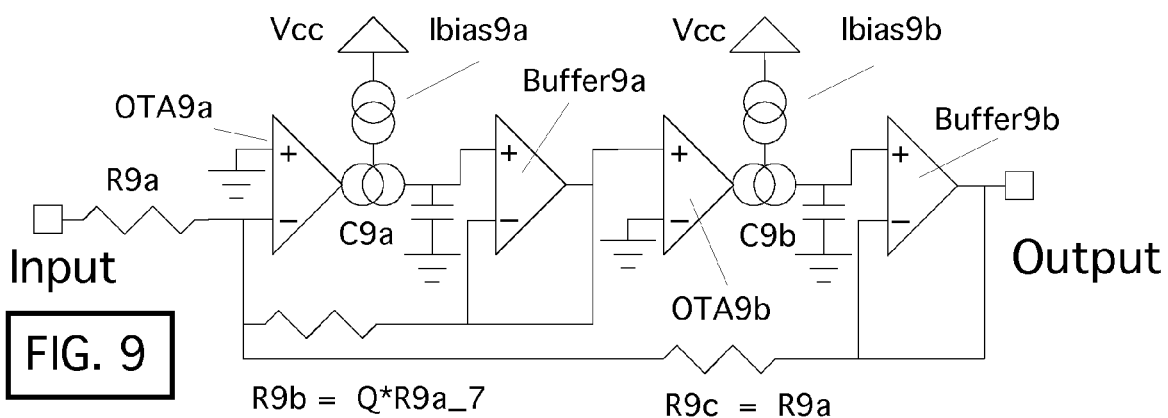
FIG. 9 illustrates how biasing a Operational Transconductance Amplifier stages consisting of OTA9$a$, OTA9$a$, Buffer9$a$, Buffer9$b$, C9$a$, C9$b$, R9$a$, R9$b$, and R9$c$, with a current scaling to absolute temperature also loads the output of an Operational Transconductance Amplifier with currents Ibias9$a$, Ibias9$b$ with signals compatible with the channel capacity signal format.

The filter application shown in FIG. 9 illustrates how percentage format also works in terms of loading the outputs of Operational Transconductance Amplifiers. In this filter application, the Operational Transconductance Amplifiers with their output capacitors are operating as integrator blocks. The feedback set up resistors R9a, R9b, and R9c which are buffered by Buffer9a and Buffer9a define the Q term of transfer function given above. The transconductance defined by bias currents Ibias9a and Ibias9b and capacitors C9a and C9b define the frequency response. At low frequencies, the output capacitors C9a and C9b are high impedance and therefore do not load OTA9a and OTA9b. When the frequencies are high enough to require 10% of the available output current, this will be reflected as requiring a 10% of recommended input voltage being applied across the inputs of OTA9a and OTA9b. As in FIG. 8, all signal voltages and signal currents will scale to absolute temperature. But with the transconductance being temperature independent, the corner frequency of the filter will remain temperature independent. The output capacitor will be swinging both higher voltages and currents at higher temperatures, but the percentage loading will remain the same at both the output and the input, regardless of temperature. So with signal in the percentage format, both gain and frequency response can be optimize for performance over temperature as well.

The invention's method to stabilizing impedances does have one drawback. When the bias currents to Operational Transconductance amplifier stages are change, their relative noise changes as shown in equation (2). Over the full temperature range, this amounts to about a ±1.3 dB change in the signal to noise ratio. The prior Art shown in FIG. 4 has a ±2.45 dB change in the signal to noise under the same conditions.

Figure 10:
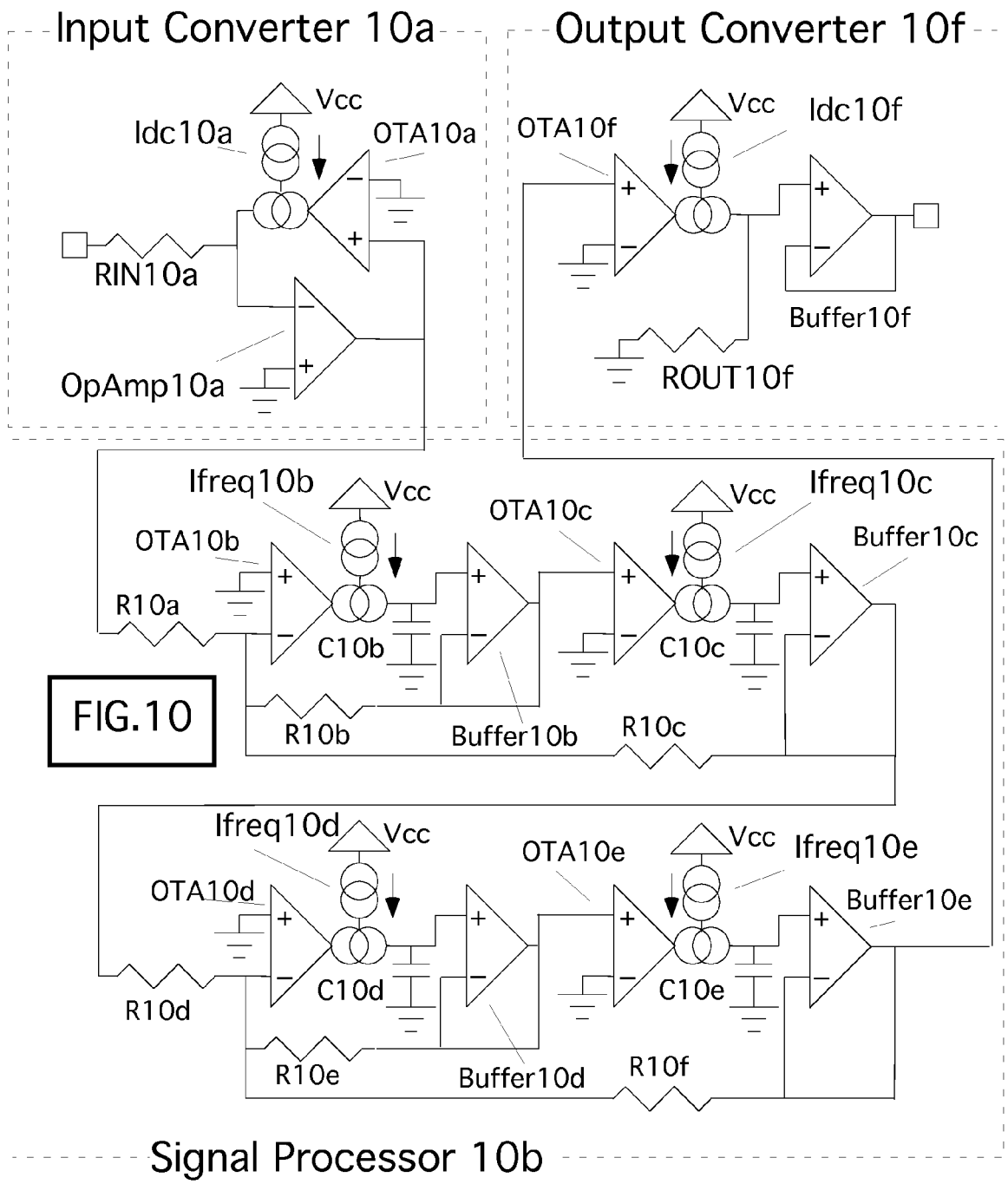
FIG. 10 illustrates a example 4 pole lowpass filter application which converts a signal from voltage to channel capacity signal format in Input Converter stage 10$a$, then 4 pole lowpass filters the signal in Signal Processor 10b then reconverts the signal back to voltage format in Output Converter 10f.

FIG. 10 shows a preferred embodiment of the invention. This embodiment is using a four pole low-pass filter in the Signal Processor 10b as an example of a 15 multiple of interconnected Operational Transconductance amplifier stages being designed to produce an output signal at optimum performance. The Input Converter 10a at the top left shows OTA10a which while being biased by a DC current Idc10a being driven by OpAmp10a with a percentage based voltage signal to produce a percentage base output current. This signal is coupled to all the other Operational Transconductance amplifier stages consisting of OTA Stages OTA10b, OTA10c, OTA10d, OTA10e, Buffer stages Buffer10b, Buffer10c, Buffer10d, Buffer10e, capacitors C10b, C10c, C10d, C10e, and resistors R10a, R10b, R10c, R10d, R10e, and R10f.

Input signals are normally voltage signals with a limited magnitude. The values of bias current Idc10a and resistor RIN10a are both chosen such that a maximum peak input voltage at RIN10a will require 50% of the maximum available output current of OTA10a. Operation Amplifier OpAmp10a is driving the input to OTA10a to cancel the current coming in from RIN10a. If both the resistance to RIN10a and the bias current Idc10a are constant with temperature, then this 50% channel capacity for OTA10a will be constant with temperature too. The output to OpAmp10a can then be used to drive everything in the Signal Processor 10b block.

In the Signal Processor 10b, signal gets processed in each Operational Transconductance amplifier stages at a percentage of capacity mode. The best way to monitor the performance of the Operational Transconductance amplifier stages is to monitor the input voltage as a percent of the input voltage capacity over the full frequency range. Once the performance has been optimized at room temperature, it will remain optimized over temperature.

The final stage consisting of OTA10f, ROUT10f, and Buffer10f involves the conversion from the channel capacity signal back into the standard voltage format. If the bias current Idc10f and resistance of ROUT 10f were to both be temperature independent, then a fixed percentage signal will produce a fixed output voltage.

The invention is intended to stabilize transconductance while optimizing performance over temperature for an application using a multiple of Operational Transconductance amplifier stages. The preferred embodiment shows the methods involved in the temperature scaling of both the signal voltages and bias currents for all Operational Transconductance amplifiers in the signal path, thereby stabilizing both impedances and performances. The methods include a channel capacity format by which to measure and design the performance in each and every Operational Transconductance amplifier stage. Included is the circuitry with its method to translate input signal voltage in to channel capacity format using channel capacity format to optimize the actual signal conversion. The circuitry and methods to convert signal back into a voltage format are also included.

While the invention has been shown in this particular embodiment, it will be understood by those skilled in the art that the Operational Transconductance Amplifier architectures are not limited to the ones having been shown. Since the applications are can be parallel or serial, and are not limited filter or attenuator applications. Likewise, CMOS devices can be substituted for bipolar devices. All of these substitutions can all be made with out departing from the spirit and scope of the invention

What is claimed is:

1. An architecture for scaling a plurality of input voltage signals into a transconductance output capacity percentage format comprising:

means for coupling said plurality of input voltage signals which drive a plurality of transconductance amplifiers to produce a plurality of output current signals which correspond to said transconductance output capacity percentage format; and means for coupling said plurality of output current signals to a plurality of output voltage signals based on a magnitude requirement needed for said plurality of input voltage signals to drive said plurality of transconductance amplifiers at said transconductance output capacity percentage format;

wherein the transconductance output capacity percentage format serves to temperature stabilize a set of output signal performance requirements defined as a total harmonic distortion level, a signal to noise ratio, a signal to DC offset, and a signal gain tolerance.

2. An architecture for scaling a plurality of input voltage signals into a transconductance output capacity percentage format comprising:

resistance means for coupling an input voltage signal as an input signal current to an output current responding node of a transconductance amplifier architecture; and means for maintaining complete coupling of said input signal current to said output current responding node by applying a negative feedback derived voltage to an input voltage node of said transconductance amplifier architecture; and means for coupling said input voltage node as a percentage scaled input voltage to drive said plurality of transconductance amplifiers to produce a plurality of output current signals corresponding to said transconductance output capacity percentage format; and means to couple said plurality of output current signals to a plurality of output voltage signals to a magnitude requirement needed for said plurality of input voltage signals to drive said plurality of transconductance amplifiers at said transconductance output capacity percentage format to temperature stabilize a set of output signal performance requirements defined as a total harmonic distortion level, a signal to noise ratio, a signal to DC offset, and a signal gain tolerance.

3. An architecture of claim 1, wherein said plurality of input voltage signals are scaled to said magnitude requirement by coupling a plurality of biasing currents to said plurality of transconductance amplifiers scaled at a plurality of ratios of a common reference current source derived from coupling a temperature scaled reference voltage across a biasing resistor which has a temperature scaled resistance value; and said plurality of output current signals are scaled to said magnitude requirement by coupling a plurality of load resistors having said temperature scaled resistance value to a plurality of output current nodes of said plurality of trans conductance amplifiers.

4. An architecture of claim 1, wherein said plurality of input voltage signals are scaled to said magnitude requirement by coupling a plurality of biasing currents to said plurality of transconductance amplifiers scaled at a plurality of ratios of a common reference current source derived from coupling a temperature scaled reference voltage across a biasing resistor which has an approximate temperature scaled resistance value; and said plurality of output current signals are scaled to said magnitude requirement by coupling a plurality of load resistors having said approximate temperature scaled resistance value to a plurality of output current nodes of said plurality of transconductance amplifiers; and where a slight noise temperature dependence is maintained due to said plurality of biasing currents for said plurality of transconductance amplifiers having a slight temperature dependence.

5. An architecture of claim 1, wherein said plurality of input voltage signals are scaled to said magnitude requirement by coupling a plurality of biasing currents to said plurality of transconductance amplifiers scaled at a plurality of ratios of a common reference current source derived from coupling a temperature scaled reference voltage across a biasing resistor which has a temperature stable value; and said plurality of output current signals are scaled to said magnitude requirement by coupling a plurality of load impedances having said temperature stable value to a plurality of output current nodes of said plurality of transconductance amplifiers;

where a temperature independent frequency response is maintained due to said plurality of input voltage signals operating at said transconductance output capacity percentage format and said plurality of transconductance amplifiers operating with a temperature independent voltage to current relationship.

6. An architecture of claim 1, wherein said plurality of input voltage signals are scaled to said magnitude requirement by coupling a plurality of temperature defined biasing currents to said plurality of transconductance amplifiers which are scaled by a plurality of current generation means.

7. An architecture of claim 1, wherein a plurality of load impedances means are coupled to said plurality of output current nodes of said plurality of trans conductance amplifiers; and said plurality of temperature defined biasing currents depending on said plurality of load impedances means scale said plurality of output current signals to said magnitude requirement for said plurality of input voltage signals to drive said plurality of transconductance amplifiers at said transconductance output capacity percentage format.

8. An architecture of claim 1, wherein said transconductance output capacity percentage format corresponds to a ratio of output peak signal current relative to a maximum available output current for a given transconductance architecture, where a fifty percent output capacity current corresponds to a peak output current magnitude which is half of the maximum available output current.

* * * * *